(12) United States Patent
Choung et al.

(10) Patent No.: US 7,708,900 B2
(45) Date of Patent: May 4, 2010

(54) CHEMICAL MECHANICAL POLISHING SLURRY COMPOSITIONS, METHODS OF PREPARING THE SAME AND METHODS OF USING THE SAME

(75) Inventors: Jae Hoon Choung, Kyoungki-do (KR); In Kyung Lee, Kyoungki-do (KR); Won Young Choi, Seoul (KR); Tae Young Lee, Kyoungki-do (KR); Ji Chul Yang, Seoul (KR)

(73) Assignees: Cheil Industries, Inc. (KR); Samsung Electronics Co., Ltd. (KR)

( * ) Notice: Subject to any disclaimer, the term of this patent is extended or adjusted under 35 U.S.C. 154(b) by 439 days.

(21) Appl. No.: 11/591,274

(22) Filed: Nov. 1, 2006

(65) Prior Publication Data

US 2007/0102664 A1 May 10, 2007

(30) Foreign Application Priority Data

Nov. 4, 2005 (KR) ........................ 10-2005-0105280

(51) Int. Cl.
*C03C 15/00* (2006.01)
*C03C 25/68* (2006.01)

(52) U.S. Cl. .................. 216/88; 252/79.1; 438/692; 438/695; 438/745; 438/22

(58) Field of Classification Search ............... 216/88; 252/79.1; 438/692, 695, 745, 22
See application file for complete search history.

(56) References Cited

U.S. PATENT DOCUMENTS

| | | | |
|---|---|---|---|
| 3,262,766 A | 7/1966 | Nonamaker | 51/308 |
| 3,768,989 A | 10/1973 | Goetzinger et al. | 51/309 |
| 4,169,337 A | 10/1979 | Payne | 51/283 |
| 5,139,571 A | 8/1992 | Deal et al. | 106/3 |
| 5,759,917 A | 6/1998 | Grover et al. | 438/690 |
| 5,938,505 A | 8/1999 | Morrison et al. | 451/36 |
| 6,152,148 A | 11/2000 | George et al. | |
| 6,600,557 B1 * | 7/2003 | Stefanescu et al. | 356/237.2 |
| 2004/0033366 A1 * | 2/2004 | Lamanna et al. | 428/421 |
| 2004/0112753 A1 | 6/2004 | Kesari et al. | |
| 2005/0090104 A1 | 4/2005 | Yang et al. | |

FOREIGN PATENT DOCUMENTS

EP 0 342 997 A2 11/1989
WO WO 2005019364 A1 * 3/2005

OTHER PUBLICATIONS

Laikhtman et al. (Journal of Chromatography (Elservier) A, 822 (1998) pp. 321-325.*

* cited by examiner

*Primary Examiner*—Nadine G Norton
*Assistant Examiner*—Mahmoud Dahimene
(74) *Attorney, Agent, or Firm*—Myers Bigel Sibley & Sajovec PA

(57) ABSTRACT

Provided herein are chemical mechanical polishing (CMP) slurries and methods for producing the same.

Embodiments of the invention include CMP slurries that include (a) a metal oxide; (b) a quaternary ammonium base; and (c) a fluorinated surfactant. In some embodiments, the fluorinated surfactant is a non-ionic perfluoroalkyl sulfonyl compound.

Also provided herein are methods of polishing a polycrystalline silicon surface, including providing a slurry composition according to an embodiment of the invention to a polycrystalline silicon surface and performing a CMP process to polish the polycrystalline silicon surface.

5 Claims, No Drawings

CHEMICAL MECHANICAL POLISHING SLURRY COMPOSITIONS, METHODS OF PREPARING THE SAME AND METHODS OF USING THE SAME

CROSS-REFERENCE TO RELATED APPLICATION

This application claims priority under 35 U.S.C. §119 from Korean Patent Application No. 10-2005-0105280, filed on Nov. 4, 2005, in the Korean Intellectual Property Office, the disclosure of which is incorporated by reference herein as if set forth in its entirety.

FIELD OF THE INVENTION

The present invention relates to chemical mechanical polishing (CMP) slurry compositions, and more particularly to CMP slurry compositions for polishing polycrystalline silicon surfaces. The present invention also relates to methods of preparing CMP slurry compositions and methods of polishing polycrystalline silicon surfaces.

BACKGROUND OF THE INVENTION

Ultra large scale integration (ULSI) of integrated circuit technology, which may be represented by 512M-bit and 1G-bit Dynamic Random Access Memories (DRAMs), may be achieved through high performance and high integration of semiconductor devices. Thus, as the minimum processing size required for the fabrication of devices becomes smaller, relatively small line widths (e.g., 60 to 70 nm) may be formed in the fabrication of next-generation devices.

Integration in integrated circuits has resulted in the reduction of the size of semiconductor devices and a need for multilevel interconnection. Highly integrated semiconductor devices may be fabricated by repeatedly and alternately depositing conductive and insulating materials over one another to form patterns. When the surface of each material layer is not planarized upon pattern formation, it may be difficult to form new pattern layers over the top. For example, in the case where new layers are continuously laminated on non-uniform surfaces between material layers, incident light may be reflected at different angles from refracted films, resulting in inaccurate photo resist patterns upon development. Thus, it may be necessary to planarize the surface of semiconductor materials in order to achieve effective lithography. Toward this end, chemical mechanical polishing (CMP) may be a desirable planarization technique. CMP of polycrystalline silicon may be particularly important because polycrystalline silicon materials are widely used to form contacts and lines in devices in semiconductor manufacturing processes.

CMP compositions generally include a slurry, which is typically an abrasive solution. In some processes, the slurry may be supplied to the space between the wafer and the surface of a polishing pad, so that the slurry may chemically react with the surface of the wafer while the polishing pad physically removes portions of the surface of the wafer.

Slurries used in semiconductor CMP processes may include, for example, deionized water, a metal oxide, a base or acid for pH adjustment, an additive for controlling the polishing rate and selectivity, and the like. Metal oxides may include silica, alumina, ceria, zirconia, titania, and the like, which are often produced by a fuming or sol-gel process. Amine-based additives may be helpful in achieving relatively high polishing rates towards polycrystalline silicon films, while at the same time, providing low polishing rates towards insulating layers.

Various methods of altering polishing slurries in order to increase the polishing rate in CMP processes have been attempted. For example, U.S. Pat. No. 4,169,337 discusses the addition of an echant, such as aminoethylethanolamine. U.S. Pat. Nos. 3,262,766 and 3,768,989 discuss the preparation of polishing compositions by co-precipitating small amounts of other particles, such as $CeO_2$ particles during production of $SiO_2$. Further, the addition of inorganic salts, such as $Ce(OH)_4$, $NH_4SO_4$ and $Fe(SO_4)$, to a slurry is discussed in Mechanism of Glass Polishing Vol. 152, 1729, 1971. In addition, U.S. Pat. No. 4,169,337 discusses a slurry composed of silica/amine/organic salt/polyhydric alcohol; U.S. Pat. No. 4,169,337 discusses a slurry composed of silica/amine; U.S. Pat. No. 5,139,571 discusses a slurry composed of silica/quaternary ammonium salt; and U.S. Pat. No. 5,759,917 discusses a slurry composed ceria/carboxylic acid/silica; U.S. Pat. No. 5,938,505 discusses a slurry composed of tetramethyl ammonium salt/hydrogen peroxide.

Slurries used for polishing polycrystalline silicon films may have a polishing selectivity for polycrystalline silicon films relative to insulating oxide films that are used as stop layers. However, this polishing selectivity may result in dishing of the polycrystalline silicon films due to the chemical mechanical action. The occurrence of dishing may adversely affect subsequent photo processing, which may result in height differences upon the formation of polycrystalline silicon lines. As a result, the electrical properties and contact characteristics inside cells may be deteriorated. Thus, there is a need for slurry compositions that ameliorate or eliminate the problem of dishing and thus improve the within-wafer-non-uniformity.

SUMMARY OF THE INVENTION

Provided in some embodiments of the present invention are chemical mechanical polishing (CMP) slurry compositions, including:

(a) a metal oxide;

(b) a quaternary ammonium base; and (c) a fluorinated surfactant.

In some embodiments of the invention, the fluorinated surfactant may include a non-ionic perfluoroalkyl sulfonyl compound. In some embodiments, the non-ionic perfluoroalkyl sulfonyl compound may include a compound represented by Formula 1:

$$CF_3(CF_2)_nSO_2X \qquad (1)$$

wherein n may be an integer from 1 to about 20;

X may be COOR, OR, $(OCH_2CH_2)_mOCH_3$ or $(OCH_2CH(OH)CH_2)_mOCH_2CH(OH)CH_3$;

R may be a $C_{1-20}$ alkyl group;

and m may be an integer from 1 to about 100.

In some embodiments, the fluorinated surfactant is present in the slurry composition in amount in a range of about 0.001% to about 1% by weight, based on the total weight of the slurry composition.

In some embodiments of the invention, the metal oxide includes at least one of $SiO_2$, $Al_2O_3$, $CeO_2$, $ZrO_2$ and $TiO_2$. In particular embodiments, the metal oxide may have a primary particle size in a range of about 10 nm to about 200 nm and a specific surface area in a range of about 10 to about 300 $m^2/g$.

Also provided are methods of preparing slurry compositions according to embodiments of the invention.

In addition, provided herein are methods of polishing a polycrystalline silicon surface, including supplying a slurry composition according to an embodiment of the invention to a polycrystalline silicon surface and performing a CMP process to polish the polycrystalline silicon surface.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All references cited in the present specification are herein incorporated by reference.

In some embodiments of the present invention, chemical mechanical polishing (CMP) slurry compositions may include
(a) a metal oxide;
(b) a quaternary ammonium base; and
(c) a fluorinated surfactant.

Any suitable metal oxide may be used provided that it can be produced by a fuming or sol-gel process. Suitable metal oxides include, but are not limited to, silica ($SiO_2$), alumina ($Al_2O_3$), ceria ($CeO_2$), zirconia ($ZrO_2$), and titania ($TiO_2$), and the like. The metal oxides may be used alone or in combination.

In some embodiments of the invention, the metal oxide has a primary particle size in a range of about 10 nm to about 200 nm, and in some embodiments in a range of about 20 nm to about 200 nm, as determined by transmission electron microscopy (TEM). In some embodiments, the metal oxide has a specific surface area in a range of about 10 to about 300 $m^2/g$. In a particular embodiment, the metal oxide includes silica particles. When the primary particle size is below about 10 nm, the polishing rate (i.e., removal rate) may be relatively low, which may undesirably decrease throughput. However, when the primary particle size is above about 200 nm, a significant quantity of large particles may be present, which may lead to the formation of μ-scratches. In some embodiments of the present invention, the metal oxide is present in the slurry in an amount in a range of about 0.1 to about 30% by weight, and in some embodiments, in a range of about 1 to about 20% by weight, based on the total weight of the composition.

CMP slurry compositions according to embodiments of the present invention may have a pH of at least about 9, which may provide for a desirable polycrystalline silicon polishing rate. Toward this end, CMP slurry compositions according to embodiments of the present invention may include a quaternary ammonium base as a pH-adjusting agent. Suitable quaternary ammonium bases include, but are not limited to, tetramethyl ammonium hydroxide, tetraethyl ammonium hydroxide, tetrapropyl ammonium hydroxide and tetrabutyl ammonium hydroxide. The quaternary ammonium bases may be used alone or in combination. In some embodiments, the quaternary ammonium base may be present in the CMP slurry composition in an amount in a range of about 0.01 to about 5% by weight, based on the total weight of the slurry. However, in some embodiments, the quaternary ammonium base may be present in the CMP slurry composition in an amount in a range of about 0.01 to about 1% by weight.

The fluorinated surfactant may be useful to control the polishing rate and may improve the within-wafer-non-uniformity of a polycrystalline silicon film.

In some embodiments, the fluorinated surfactant may include a non-ionic perfluoroalkyl sulfonyl compound. The perfluoroalkyl moiety of the non-ionic perfluoroalkyl sulfonyl compound may include a linear, branched or cyclic perfluoroalkyl. Furthermore, the non-ionic perfluoroalkyl sulfonyl compound may include a non-fluorinated alkyl spacer, such as a methylene or ethylene group, between the sulfonyl group and the perfluoroalkyl group. In some embodiments, the non-ionic perfluoroalkyl sulfonyl compound includes a compound represented by Formula 1:

$$CF_3(CF_2)_nSO_2X \quad (1)$$

wherein n may be an integer from 1 to about 20; X may be COOR, OR, $(OCH_2CH_2)_mOCH_3$ or $(OCH_2CH(OH)CH_2)_mOCH_2CH(OH)CH_3$; R may be a $C_{1-20}$ alkyl group; and m may be an integer from 1 to about 100. The term $C_{1-20}$ alkyl, as used herein, refers to an alkyl group having 1 to 20 carbon atoms. In addition, in some embodiments, n may be an integer in a range of 1 and about 8.

In some embodiments of the present invention, at least two different fluorinated surfactants represented by Formula 1 may be simultaneously used in the present invention.

In some embodiments, the fluorinated surfactant may be present in the CMP slurry composition in a range of about 0.001 to about 1% by weight, based on the total weight of the slurry. In particular embodiments, the fluorinated surfactant is present in the CMP slurry composition in an amount in a range of about 0.001 to about 0.5% by weight. When the fluorinated surfactant is present in an amount of less than about 0.001% by weight, the polishing rate of polycrystalline silicon may be too high and edge portions of a wafer may be excessively polished, which may deteriorate the within-wafer-non-uniformity. However, when the fluorinated surfactant is present in an amount exceeding about 1% by weight, the polishing rate of polycrystalline silicon may be too low and edge portions of a wafer may not be adequately polished, which may deteriorate the within-wafer-non-uniformity. In addition, by appropriately controlling the content of fluorinated surfactant in the CMP slurry composition, the edge profile may be improved and dishing may be decreased.

In some embodiments of the invention, the selectivity of a CMP slurry composition according to an embodiment of the present invention towards a polycrystalline silicon film relative to an insulating oxide film may be in a range of about 20:1 to about 100:1.

Also provided in some embodiments of the invention are methods for preparing a CMP slurry composition according to an embodiment of the invention including adding about 0.001 to about 1% by weight of a fluorinated surfactant, about 0.01 to about 5% by weight of a quaternary ammonium base and about 0.1 to about 30% by weight of the metal oxide to water, followed by agitation of the mixture. In some embodiments, the fluorinated surfactant includes a non-ionic perfluoroalkyl sulfonyl compound, and in some embodiments, the fluorinated surfactant includes a compound represented by Formula 1. In some embodiments, the water is ultrapure water.

In some embodiments of the present invention, methods of polishing a polycrystalline silicon surface include supplying a slurry composition according to an embodiment of the invention to a polycrystalline silicon surface and performing a CMP process to polish the polycrystalline silicon surface.

EXAMPLES

The present invention will now be described in more detail with reference to the following examples. However, these examples are given for the purpose of illustration and are not to be construed as limiting the scope of the invention.

Example 1

First, 200 g of 20 wt % tetramethylammonium hydroxide (TMAH) was added to 12299.5 g of ultrapure water. Ten minutes after the addition, 0.5 g of polyoxyethylene perfluorobutyl sulfonyl ester was added thereto. This mixture was combined with 2,500 g of 20 wt % colloidal silica in a reactor. The resulting mixture was stirred at 500 rpm and filtered through a 3 micron filter to obtain a slurry. Wafers were polished using the slurry for one minute under the following conditions: polishing machine: UNIPLA 211 (Semicon Tech.); polishing pad: IC1000/Suba IV K groove (Rodel); polishing substrate: F-Poly, PTEOS, 8" blanket wafer; plate Speed: 70 rpm; head speed: 70 rpm; pressure: 3.5 psi; back pressure: 0 psi; temperature: 25° C.; and slurry flow: 200 ml/min. The thickness of the wafer before and after the polishing was measured, and the within-wafer-non-uniformity (WIWNU) was evaluated at portions other than within 3 mm of the edge by 98-point analysis using an optiprobe. The results are shown in Table 1 below.

Example 2

A slurry was obtained in the same manner as in Example 1, except that 1.0 g of polyoxyethylene perfluorobutyl sulfonyl ester was added. The polishing performance of the slurry was evaluated in accordance with the procedure described in Example 1. The results are shown in Table 1 below.

Example 3

A slurry was obtained in the same manner as in Example 1, except that 1.5 g of polyoxyethylene perfluorobutyl sulfonyl ester was added. The polishing performance of the slurry was evaluated in accordance with the procedure described in Example 1. The results are shown in Table 1 below.

TABLE 1

| | Amount | | | Polishing performance | | | | |
| | | | | Poly-Si | | PTEOS | | |
| | Colloidal silica (20%) | Polyoxyethylene perfluorobutyl sulfonyl ester | TMAH (20%) | Polishing rate (Å/min.) | WIWNU (%) | Polishing rate (Å/min.) | WIWNU (%) | Selectivity |
| --- | --- | --- | --- | --- | --- | --- | --- | --- |
| Ex. 1 | 2500 g | 0.5 g | 200 g | 2121 | 2.27 | 26 | 3.15 | 82 |
| Ex. 2 | 2500 g | 1.0 g | 200 g | 1069 | 5.19 | 21 | 3.59 | 51 |
| Ex. 3 | 2500 g | 1.5 g | 200 g | 708 | 7.66 | 29 | 3.36 | 24 |

Comparative Example 1

A slurry was obtained in the same manner as in Example 1, except that polyoxyethylene perfluorobutyl sulfonyl ester was omitted. The polishing performance of the slurry was evaluated in accordance with the procedure described in Example 1. The results are shown in Table 2 below.

Comparative Example 2

A slurry was obtained in the same manner as in Example 1, except that TMAH was omitted. The polishing performance of the slurry was evaluated in accordance with the procedure described in Example 1. The results are shown in Table 2 below.

TABLE 2

| | Amount | | | Polishing performance | | | | |
| | | | | Poly-Si | | PTEOS | | |
| | Colloidal silica (20%) | Polyoxyethylene perfluorobutyl sulfonyl ester | TMAH (20%) | Polishing rate (Å/min.) | WIWNU (%) | Polishing rate (Å/min.) | WIWNU (%) | Selectivity |
| --- | --- | --- | --- | --- | --- | --- | --- | --- |
| Comp. Ex. 1 | 2500 g | — | 200 g | 3564 | 18.95 | 30 | 15.41 | 119 |
| Comp. Ex. 2 | 2500 g | 0.5 g | — | 103 | 17.67 | 92 | 13 | 1 |

As can be seen from the data shown in Tables 1 and 2, the simultaneous use of the fluorinated surfactant and the quaternary ammonium base provided a reduction in the number of surface defects on the wafers, while maintaining a sufficient selectivity, when compared to using the two components individually.

As apparent from the above description, the present invention provides CMP slurry compositions for polishing polycrystalline silicon films that may improve or eliminate the problem of dishing, thus providing desirable within-wafer-non-uniformity, while maintaining sufficient selectivity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method for polishing a polycrystalline silicon surface, comprising
    supplying a slurry composition to a polycrystalline silicon surface, wherein the slurry composition comprises (a) a metal oxide; (b) a quaternary ammonium base; and (c) a non-ionic perfluoroalkyl sulfonyl compound; and performing a CMP process to polish the polycrystalline silicon surface, wherein the non-ionic perfluoroalkyl sulfonyl compound comprises a compound represented by Formula 1:

$$CF_3(CF_2)_n SO_2 X \qquad (1)$$

wherein n is an integer from 1 to about 20;
X is selected from the group consisting of COOR, OR, $(OCH_2CH_2)_m OCH_2CH_3$ and $(OCH_2CH(OH)CH_2)_m OCH_2CH(OH)CH_3$;
R is a $C_{1-20}$ alkyl group;
and m is an integer from 1 to about 100.

2. The method of claim 1, wherein the fluorinated surfactant is present in an amount in a range of about 0.001% to 1% by weight, based on the total weight of the slurry composition.

3. The method of claim 1, wherein the metal oxide comprises at least one compound selected from the group consisting of $SiO_2$, $Al_2O_3$, $CeO_2$, $ZrO_2$ and $TiO_2$.

4. The method of claim 1, wherein the metal oxide has a primary particle size in a range of about 10 nm to about 200 nm and specific surface area in a range of about 10 to about 300 $m^2/g$.

5. The method of claim 1, wherein the quaternary ammonium base comprises at least one compound selected from the group consisting of tetramethyl ammonium hydroxide, tetraethyl ammonium hydroxide, tetrapropyl ammonium hydroxide, tetrabutyl ammonium hydroxide.

* * * * *